(12) United States Patent
Kosugi

(10) Patent No.: US 7,423,726 B2
(45) Date of Patent: Sep. 9, 2008

(54) EXPOSURE APPARATUS AND DEVICE MANUFACTURING METHOD

(75) Inventor: Yuji Kosugi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/692,471

(22) Filed: Mar. 28, 2007

(65) Prior Publication Data

US 2007/0229788 A1    Oct. 4, 2007

(30) Foreign Application Priority Data

Apr. 4, 2006    (JP) .............................. 2006-103627

(51) Int. Cl.
G03B 27/42    (2006.01)
G03B 27/68    (2006.01)

(52) U.S. Cl. .......................................... 355/53; 355/52
(58) Field of Classification Search .................. 355/52, 355/53, 55, 67; 250/548; 356/399–401
See application file for complete search history.

(56) References Cited

U.S. PATENT DOCUMENTS

| | | | |
|---|---|---|---|
| 5,750,294 A | 5/1998 | Hasegawa et al. | 430/22 |
| 6,426,508 B1 * | 7/2002 | Kosugi et al. | 250/548 |
| 6,984,838 B2 | 1/2006 | Kosugi | 250/559.3 |
| 7,009,683 B2 * | 3/2006 | Sato | 355/53 |
| 7,141,813 B2 | 11/2006 | Kosugi | 250/548 |
| 7,282,820 B2 | 10/2007 | Emoto | 310/12 |
| 2003/0132401 A1 | 7/2003 | Yamada et al. | 250/548 |
| 2004/0005058 A1 | 1/2004 | Jang et al. | 380/270 |
| 2004/0227925 A1 | 11/2004 | Sato | 355/72 |
| 2005/0088636 A1 | 4/2005 | Kurosawa | 355/53 |
| 2005/0123141 A1 | 6/2005 | Suzuki | 380/277 |
| 2005/0169515 A1 | 8/2005 | Kobayashi et al. | 382/151 |
| 2005/0212361 A1 | 9/2005 | Emoto | 310/12 |
| 2007/0229788 A1 | 10/2007 | Kosugi | 355/53 |
| 2008/0036981 A1 | 2/2008 | Emoto | 355/30 |

FOREIGN PATENT DOCUMENTS

JP    9-045609    2/1997

(Continued)

OTHER PUBLICATIONS

European Search Report dated Oct. 23, 2007, issued in corresponding European patent application No. EP 07 10 5473, forwarded in a Communication dated Nov. 6, 2007.

(Continued)

*Primary Examiner*—Hung Henry Nguyen
(74) *Attorney, Agent, or Firm*—Fitzpatrick, Cella, Harper & Scinto

(57) ABSTRACT

An exposure apparatus for exposing a substrate. A stage holds and moves the substrate, a measuring device measures a position of a surface of the substrate, and a controller defines an arrangement of measurement points with respect to each of a plurality of shot regions arranged along a straight line, and causes the measuring device to sequentially measure positions of the surface with respect to the defined measurement points in the plurality of shot regions, while the stage moves the substrate along the straight line. A timing at which the measuring device measures a position of the surface is controlled so that a first time interval and a second time interval are different from each other.

3 Claims, 12 Drawing Sheets

FOREIGN PATENT DOCUMENTS

| | | |
|---|---|---|
| JP | 2000-21768 | 1/2000 |
| JP | 2004-071851 | 3/2004 |
| JP | 2005-277030 | 10/2005 |

OTHER PUBLICATIONS

Japanese Office Action dated Apr. 18, 2008, issued in corresponding Japanese patent application No. 2006-103627.

European Search Report dated Oct. 25, 2007, issued in corresponding European patent application No. EP 07 11 0046, forwarded in a Communication dated Nov. 6, 2007.

Altunbasak, H., et al. "Alternative Pair-Wise Key Exchange Protocols for Robust Security Networks (IEEE 802.11i) in Wireless LANs," Southeastcon, 2004. Proceedings, IEEE Greensboro, NC, USA, Piscataway, NJ, USA, IEEE. pp. 3-9.

* cited by examiner

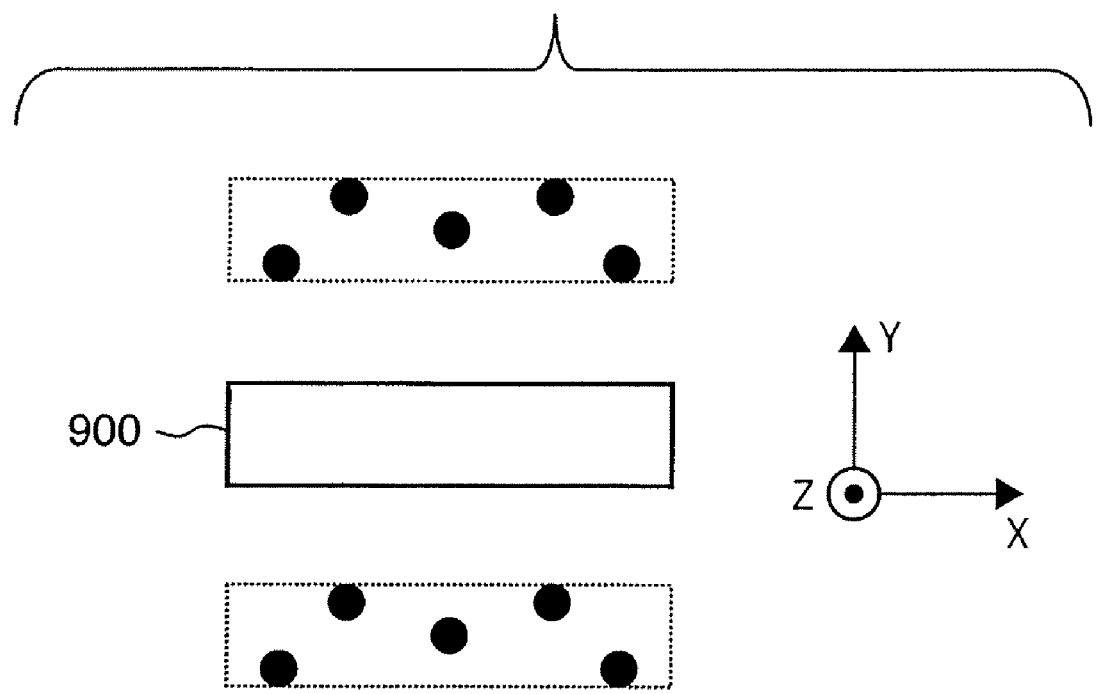
F I G. 10

EXPOSURE APPARATUS AND DEVICE MANUFACTURING METHOD

This application claims the benefit of Japanese Patent Application No. 2006-103627, filed Apr. 4, 2006, which is hereby incorporated by reference herein in its entirety.

BACKGROUND OF THE INVENTION

1. Field of the Invention

The present invention relates to an exposure apparatus that exposes a substrate to light while the substrate is scanned, and a device manufacturing method employing that exposure apparatus.

2. Description of the Related Art

When manufacturing a device, such as a semiconductor device, a liquid crystal display device, or a thin film magnetic head with a lithography process, an exposure apparatus is used that, via a projection optical system, transfers a pattern of a reticle onto a substrate on which a photosensitive agent has been applied. Higher resolution is sought in exposure apparatuses in accordance with miniaturization and higher density of devices.

The projection optical resolution of the pattern depends on the numerical aperture (NA) of the projection optical system and the exposure wavelength, and is increased by increasing the NA of the projection optical system or shortening the exposure wavelength. The shortening of the exposure wavelength has progressed, for example, in order, from g-ray, to i-ray, to excimer laser light. Shortening of the wavelength of excimer light to 248 nm, 193 nm, and further, to 157 nm, is progressing.

An exposure apparatus may employ, as is well known, a step and repeat system or a step and scan system. An exposure apparatus using a step and scan system is referred to as a scanning exposure apparatus. In particular, with a scanning system, it is possible to match the surface of the substrate to an optimal image plane position while performing scanning exposure, so it is possible to diminish a reduction in exposure precision caused by poor flatness of the substrate.

With a scanning exposure apparatus, before an exposure area (shot region) of the substrate approaches an irradiation area of slit-shaped exposure light (hereinafter, slit light), the surface position of the exposure area can be measured and corrected to the position of the image plane. The surface position is the position in the direction of the optical axis of the projection optical system.

For example, it is possible to measure the surface position using a light oblique incident type surface-position detecting apparatus, or a gap sensor, such as an air microsensor or an electrostatic capacitive sensor. Further, it is possible to arrange or to define a plurality of measurement points in order to measure the tilt of the surface in addition to the height position.

FIGS. 9 and 10 show example arrangements of measurement points. In the example shown in FIG. 9, three measurement points of the surface-position detecting apparatus are arranged in both the front and to the rear in the scanning direction (Y direction) of a slit light 900. In the example shown in FIG. 10, five measurement points of the surface-position detecting apparatus are arranged in both the front and to the rear in the scanning direction (Y direction) of the slit light 900. Measurement points are arranged in both the front and to the rear in the slit direction, so that, with scanning for exposure performed in both the +Y direction and the −Y direction, the surface position of the substrate is measured immediately before exposure in either direction.

Japanese Patent Laid-Open No. 09-045609 discloses a method of measuring the focus and tilt of scanning exposure.

Japanese Patent Laid-Open No. 2004-071851 discloses a method of controlling and driving the focus and tilt using wafer surface information obtained in advance with a focus detecting system provided separately from an exposure apparatus.

The miniaturization trend has been accompanied by the focal depth becoming extremely small, and thus, demands for so-called focus precision, meaning the precision of matching the surface of the substrate to be exposed to an optimal image plane, have become more and more intense.

In particular, it has become clear that in a substrate with an imprecise surface shape, the precision of focus detection in exposure areas becomes a problem. In a numerical example, the required control of flatness of the substrate relative to the focal depth of the exposure apparatus is ordinarily $\frac{1}{10}$ to $\frac{1}{5}$ of the focal depth, and is 0.04 to 0.08 μm when the focal depth is 0.4 μm. As is shown, for example, in FIG. 7, when the surface position of the substrate is corrected based on the information of measurement points FP1, FP2, and FP3 arranged at equal intervals, information of the surface position of the substrate is not present between the measurement points. Accordingly, an offset amount Δ of defocusing occurs between the actual surface position of the substrate and the surface obtained from the surface position information FP1, FP2, and FP3. Such a defocusing factor is referred to as a focus sampling error.

In order to reduce the focus sampling error, the focus sampling interval should be reduced. Here, for example, the focus sampling error can be determined based on the detection area and the sampling period of the measurement sensor, a sampling period corresponding to the residual vibration mode of the structural body of the exposure apparatus, the control frequency of the control system, or the like. For example, a case is conceivable in which measurement points are arranged at 1 mm intervals in the scanning direction, and light oblique incident type measurement points are arranged at 1 mm intervals in a direction perpendicular to the scanning direction. In this case, the surface information across the entire range of the substrate is obtained as information mapped to a grid of 1 mm intervals in the scanning direction and 1 mm intervals in the direction perpendicular to the scanning direction.

However, at the point of production, products with various chip sizes are produced due to the introduction of a cut-down substrate, a shrunken substrate, and the like, accompanying trends of chip diversification and miniaturization. Accordingly, with the arrangement of measurement points depending on the performance and configuration of the apparatus as described above, the positional relationship of a shot and measurement points changes each time the shot is crossed. As a result, local defocusing occurs at a portion near the edge of the shot, particularly, in a case in which the distance increases between a measurement point and the position where exposure starts and/or the position where exposure ends. A shot region can be configured to include one or a plurality of chip areas.

SUMMARY OF THE INVENTION

According to one aspect of the present invention, there is provided an exposure apparatus for exposing a substrate to light while the substrate is scanned. The apparatus comprises a stage configured to hold the substrate and to move, a measuring device configured to measure a position of a surface of the substrate held by the stage, a controller configured to define an arrangement of measurement points with respect to each of a plurality of shot regions arranged along a straight line, and to cause the measuring device to sequentially measure positions of the surface with respect to the defined measurement points in the plurality of shot regions, while causing the stage to move to scan the substrate along the straight line, by controlling a timing at which the measuring device measures a position of the surface, so that a first time interval and a second time interval are different from each other, the first time interval being an interval between a first time at which the measuring device measures a position of the surface with respect to the last measurement point in a first shot region and a second time at which the measuring device measures a position of the surface with respect to a second measurement point adjacent to the last measurement point in the first shot region, the second time interval being an interval between the first time and a third time at which the measuring device measures a position of the surface with respect to the first measurement point in a second shot region next to the first shot region.

Further features of the present invention will become apparent from the following description of exemplary embodiments with reference to the attached drawings.

BRIEF DESCRIPTION OF THE DRAWINGS

FIG. 10 shows an example arrangement of measurement points.

DESCRIPTION OF THE EMBODIMENTS

Embodiments of the present invention will now be described in detail with reference to the accompanying drawings. The embodiments reduce a disadvantage, such as local defocusing, caused by variations in the positional relationship between shot regions and measurement points among a plurality of shot regions.

Figure 1:
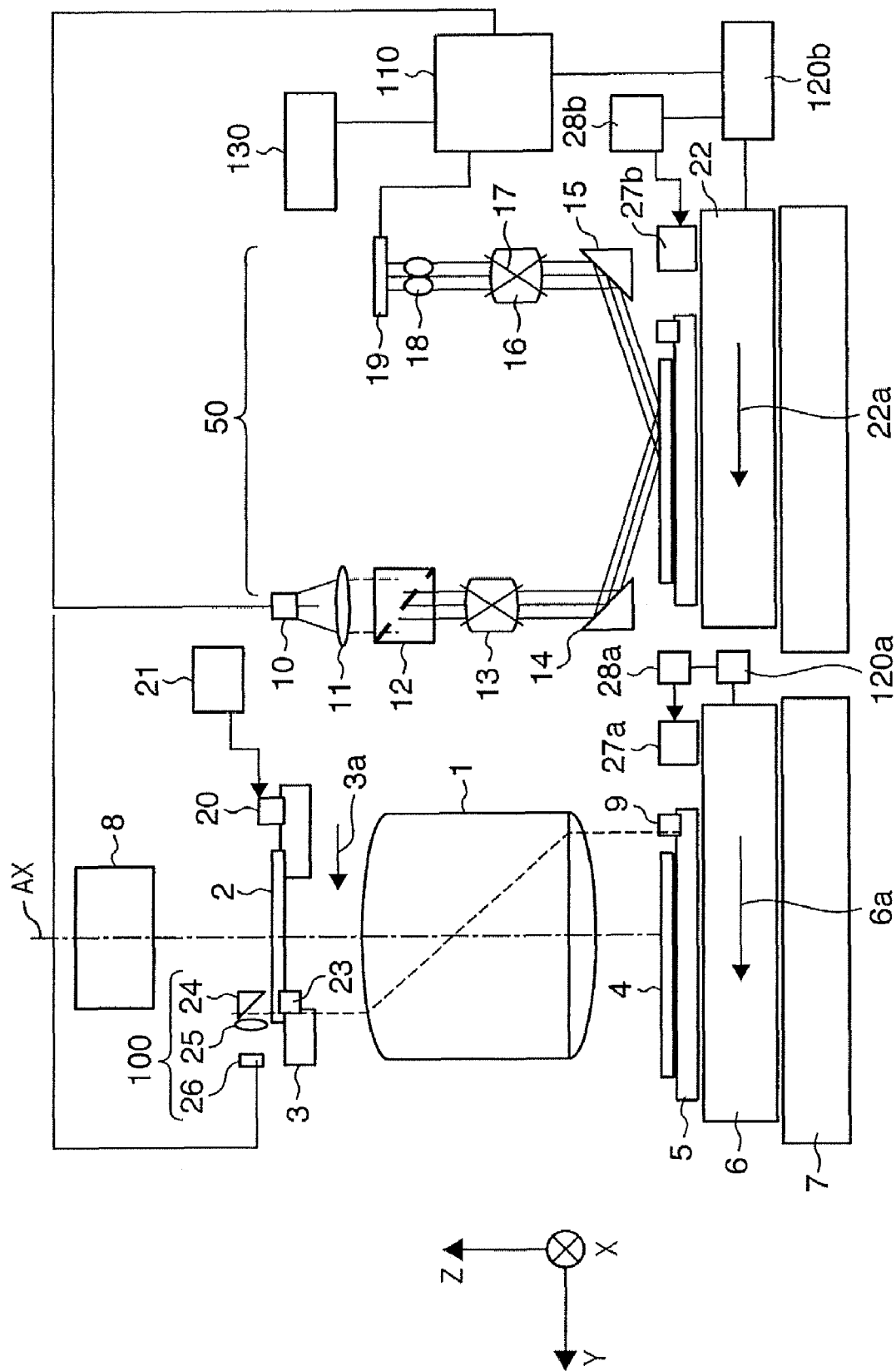
FIG. 1 shows the overall configuration of an exposure apparatus according to an exemplary embodiment of the present invention.

FIG. 1 shows the overall configuration of an exposure apparatus according to an exemplary embodiment of the present invention. An example is described as being applied to a scanning exposure apparatus.

A scanning exposure apparatus is driven with a reticle 2 having a pattern held by a reticle stage 3. The reticle 2 is output from an illumination optical system 8, and illuminated by a slit light obtained by being formed by a slit member. Thus, an image of the pattern of the reticle 2 is formed in the image plane of a projection optical system 1 by the slit light. A substrate (wafer) 4, on which a photosensitive agent (photoresist) has been applied, is positioned in the image plane. Below, the substrate, on which a photosensitive agent has been applied, is referred to merely as the substrate.

A plurality of shot regions are aligned on the substrate 4. The plurality of shot regions includes shot regions arranged along a straight line. Each shot region is configured to include one or a plurality of chip areas. The exposure apparatus is configured so as to expose the plurality of shot regions on the substrate, in order, via the projection optical system 1. The substrate 4 is held by a substrate chuck 5.

The substrate chuck 5 is mounted on an exposure stage mechanism 6. The exposure stage mechanism 6 is configured as an apparatus that can drive the substrate 4 in six axis-directions. The exposure step mechanism 6 includes, for example, an XY stage drivable in the X and Y axis directions, a leveling stage drivable in the Z axis direction and around the X and Y axes, and a rotation stage drivable around the Z axis. The Z axis matches an optical axis AX of the projection optical system 1. The exposure stage mechanism 6 is provided on a surface plate 7.

A first surface-position detecting unit 50 detects the surface position (or, the height position and position in the Z axis direction) and tilt of the substrate 4, and includes components 10 to 19. A light source 10 is configured to include a white lamp, or a light emitting diode with high luminance having a plurality of distinct peak wavelengths. The light source 10 emits light beams that have approximately the same cross-sectional density distribution and become parallel due to the use of a collimator lens 11.

A light beam emitted from the collimator lens 11 is incident at a plurality of measuring points (here, described as twenty-five points) on the surface of the substrate 4, via a slit member 12, an optical system 13, and a mirror 14. The slit member 12 has a prism-like shape, and is formed by bonding a pair of prisms, such that the sloping faces of those prisms face each other, and, on the bonded face, a light shielding film constituted from chrome, and the like, is provided. Formed in this light shielding film are openings (for example, pin holes) corresponding to the number of measuring points.

The optical system 13 is a double telecentric optical system. The surface of the light shielding film having twenty-five pin holes provided in the slit member 12, and the surface of the substrate 4, satisfy Scheimpflug's condition for the optical system 13.

The angle of incidence Φ (angle relative to a line perpendicular to the surface of the substrate 4) of the twenty-five light beams on the surface of the substrate 4 is not less than 70°.

Figure 2:
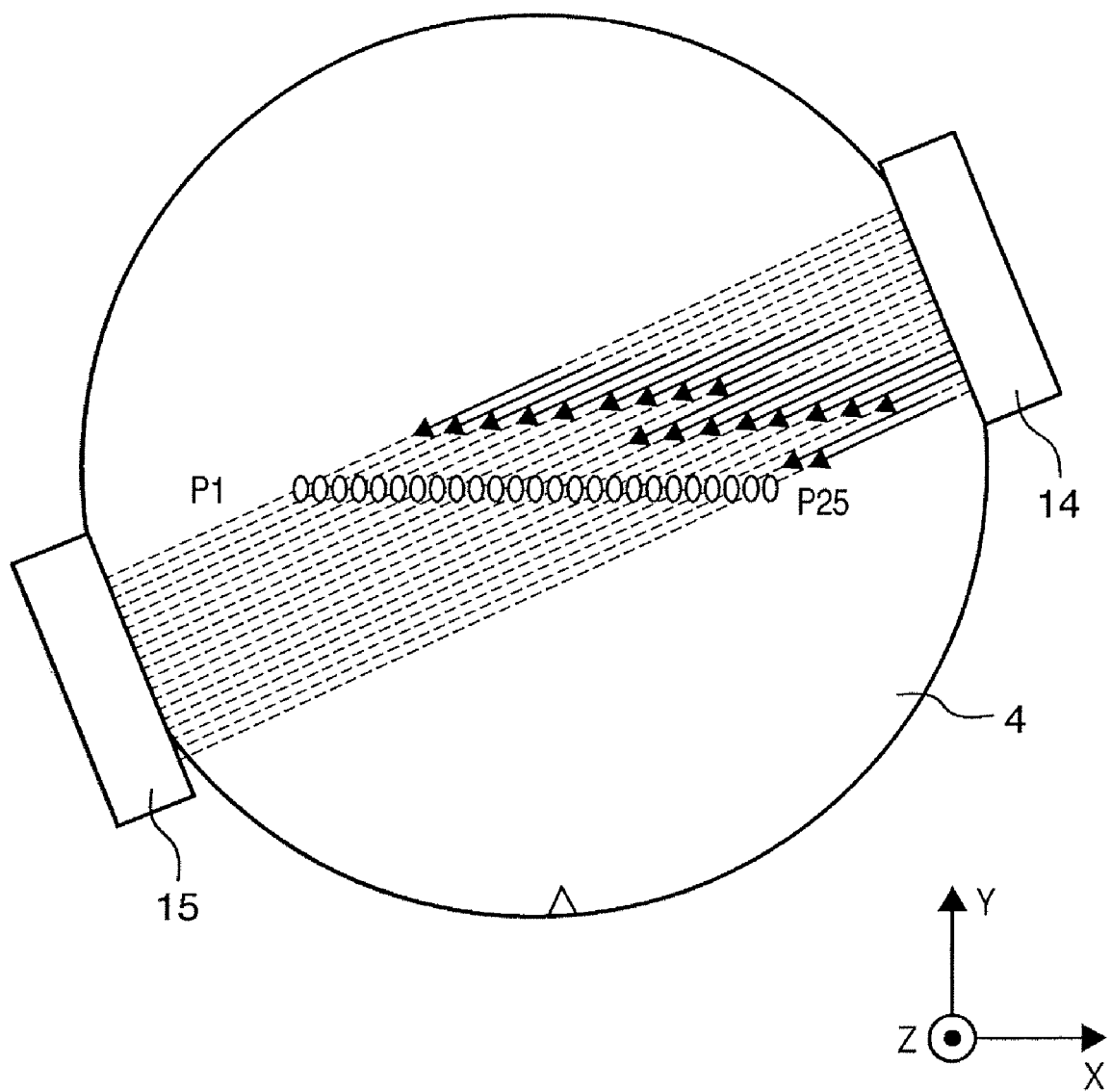
FIG. 2 shows an example of a light beam for plane position detection in a first plane position detecting unit.
Figure 3:
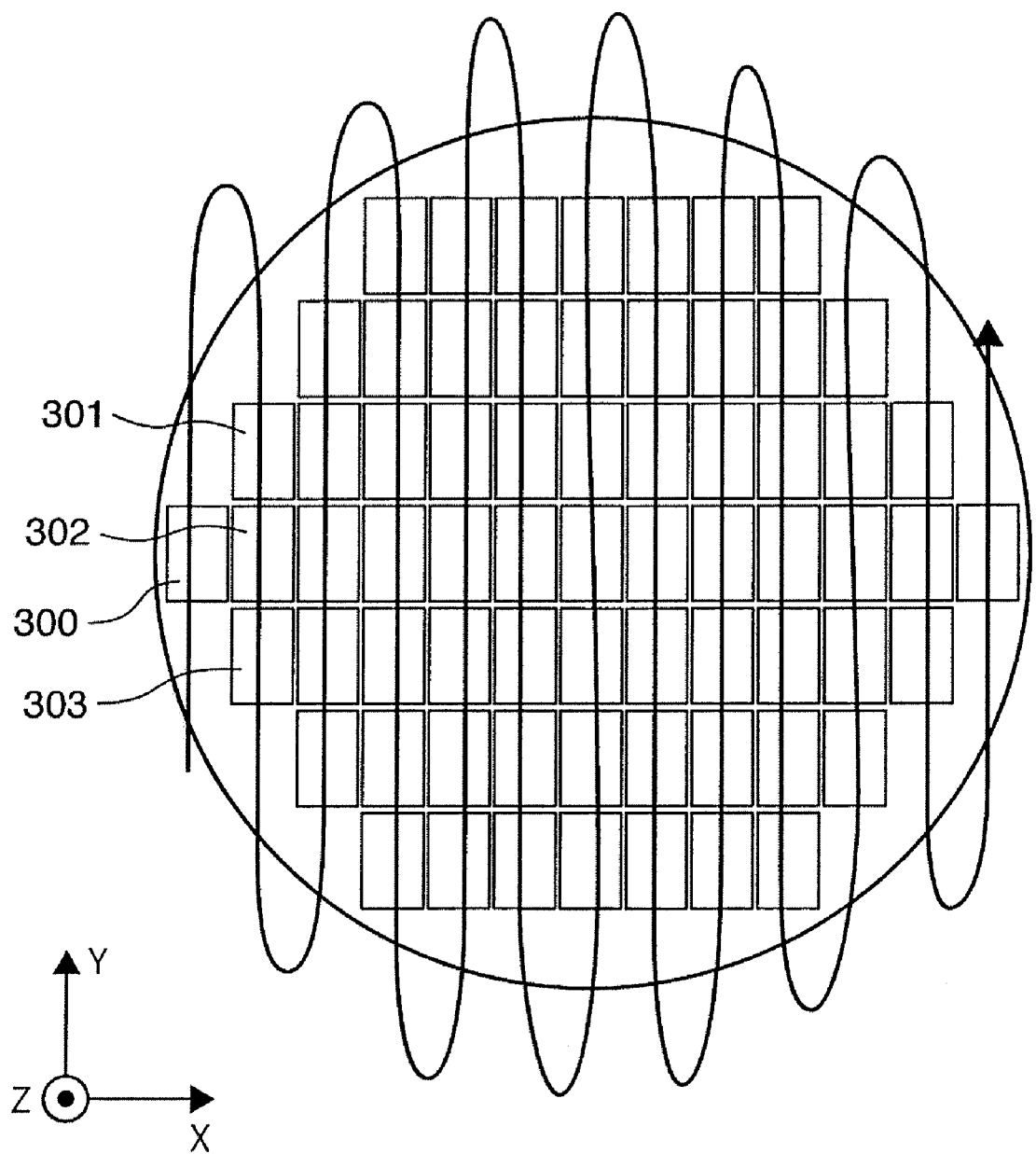
FIG. 3 shows an example of a measurement sequence for an exposure area of a substrate.

As shown, for example, in FIG. 3, a plurality of shot regions having the same pattern structure are aligned or defined on the surface of the substrate 4. The twenty-five light beams, after passing through the optical system 13, are incident on and form an image at the measurement points of the pattern area, the measurement points being independent from each other, as shown, for example, in FIG. 2. The twenty-five measurement points in FIG. 2 are arranged in the X direction to cover the width (length in the direction perpendicular to the scanning direction) of the slit light on the surface of the substrate. For example, by arranging the measurement points so as to cover an area that is twice the width of the slit light on the substrate, it is possible to reduce the time needed for measurement by half.

The optical axis of the light beam for measurement can be arranged in a direction rotated by θ° (for example, 22.5°) from the X direction in the XY horizontal plane, such that the twenty-five measurement points are observed independently from each other on the surface of the substrate 4.

Next, a light beam reflected from the substrate 4 forms an image on a detection surface of a photo sensor 19 via a mirror 15, a light-receiving optical system 16, and correction optical system 18. The light-receiving optical system 16 is configured as a double telecentric optical system, and inside the light-receiving optical system 16, an aperture 17 is provided. The aperture 17 is provided in common for the twenty-five measurement points, and cuts high-order diffraction light (noise light) generated by the circuit pattern present on the substrate 4.

After passing through the light-receiving optical system 16, the optical axes of the twenty-five light beams become parallel to each other, and images are reformed on the detection surface of the photoelectric sensor 19 by twenty-five individual correction lenses of the correction optical systems 18 to form twenty-five spots.

The components 16 to 18 perform tilt correction, such that the measurement points on the surface of the substrate 4 and the detection surface of the photoelectric sensor 19 are coupled to each other. Accordingly, changes in position of pin hole images on the detection surface occurs in response to changes in height in the optical axis direction AX of the measurement points, without allowing changes in the position of pin hole images on the detection surface due to local tilt of the measurement points.

Here, for example, the photoelectric sensor 19 can be configured with twenty-five one-dimensional CCD line sensors, but the same effect can be obtained in a case in which the photoelectric sensor 19 is configured by providing a plurality of two-dimensional position detecting devices.

As shown in FIG. 1, the reticle 2, after being held by the stage of the reticle stage mechanism 3, is scanned with a constant speed in the plane perpendicular to the optical axis AX of the projection optical system 1, in the direction arrow 3a (the Y axis direction). At this time, the reticle 2 is driven to be corrected so as to maintain a target coordinate position in the direction perpendicular to the arrow 3a (the X axis direction).

Information of the position in the X axis and the Y axis for the stage of the reticle stage mechanism 3 is measured by irradiating a plurality of laser beams from an interference system 21 to an XY bar mirror 20 fixed to the reticle stage mechanism 3.

An illumination optical system 8, for example, can be configured with a light source that emits pulse light, such as an excimer laser, a beam shaping optical system, an optical integrator, a collimator, and a mirror. The illumination optical system 8 can be formed with a material that effectively transmits or reflects pulse light of the far ultraviolet region.

The beam-shaping optical system shapes the cross-sectional shape (including size) of the incident beam. The optical integrator allows the light distribution properties to be uniform, and illuminates the reticle 2 with uniform illumination.

A slit-shaped illumination area is prescribed by a masking blade (not shown) in the illumination optical system 8, thus forming a slit light that includes the pattern information. An exposure station is configured with components of the illumination optical system 8, the projection optical system 1, the surface plate 7, and the like, that are directly related to exposure.

One portion of the substrate chuck 5 includes a reference surface 9. On the surface plate 7, or a separately provided surface plate, the same as the exposure stage mechanism 6 on the surface plate, a separate measurement stage mechanism 22 is provided that is freely movable in six axis directions.

The substrate 4 to be processed, first, is placed on the substrate chuck mechanism 5, which is mounted on the measurement stage mechanism 22, and is held by the substrate chuck 5 with a means such as vacuum or electrostatic attraction. The surface position of each shot region of the substrate 4 is measured by a first surface-position detecting unit 50, using the reference surface 9 on the substrate chuck 5 as a reference. The results of measurement are stored in a memory 130. In the first surface-position detecting unit 50, a measurement station is configured with the elements of the measurement stage mechanism 22, and the like.

Here, the reference surface 9 on the substrate chuck 5, in order to increase the measurement accuracy, can be configured by, for example, installing a thin metal film, metal plate, or the like, on the surface of the substrate chuck 5 at about the same height as the surface of the substrate 4.

Then, when the measurement process on the measurement stage mechanism 22 is finished, the substrate 4 is fed in a state held by the substrate chuck 5 from the measurement stage mechanism 22 onto the exposure stage mechanism 6. The exposure apparatus can also be configured to be provided with two substrate chucks 5, exchanging them between the exposure stage mechanism 6 and the measurement stage mechanism 22. Alternatively, the exposure apparatus can be provided with at least one (for example, two) substrate stage mechanisms, and move that substrate stage mechanism between the exposure stage and the measurement stage.

A focusing process that matches the surface of the substrate 4 held by the substrate chuck 5 to the image plane of the projection optical system 1 is performed on the exposure stage mechanism 6. Generally stated, in the focusing process, while the height of the substrate 4 is measured by a second surface-position detecting unit 100 using the reference surface 9, the surface position of the substrate 4 is adjusted by the exposure stage mechanism 6.

Specifically, for example, the focusing process can be performed using the reference surface 9 and a focusing mark 23 provided in the pattern area of the reticle 2 or a border area thereof. The mark 23, for example, includes a pin hole, and light from the illumination optical system 8 having the same wavelength as the exposure light passes through the pin hole, so that with the projection optical system 1, an image is formed in the vicinity of the reference surface 9 on the substrate chuck 5. With the projection optical system 1, the light reflected by the reference surface 9 again reforms an image in the vicinity of the mark 23. At this time, the focusing state is detected while moving the Z stage included in the exposure stage mechanism 6. The amount of light that passes through the pin hole 23 is largest when the reticle 2 and the reference surface 9 are in a completely focused state. The light that passes through the pin hole 23 is incident on a detector 26 via a half mirror 24 and a collector lens 25. Thus, the amount of light that passes through the pin hole 23 is detected by the detector 26. The detection results are provided to a main controller 110. The main controller 110 controls the exposure stage mechanism 6 via a driver 120a, such that the Z stage is stopped at the position where the amount of light detected by the detector 26 is largest. Then, the focusing process is finished.

When the focusing process finishes, the following sort of exposure process is performed. That is, the main controller 110 controls the exposure stage mechanism 6 via a driver 120a to move the substrate chuck 5 in the XY plane, and thus, exposure is performed by moving the plurality of shot regions of the substrate 4, in order, to the exposure position. At this time, the surface of the shot region is matched to the image plane of the projection optical system 1, based on the surface position information (the position information based on the reference surface 9) of the substrate 4 already measured on the measurement stage mechanism 22 and stored in the memory 130. This is performed by the main controller 110 driving the Z stage of the exposure stage mechanism 6 via the driver 120a.

Figure 4:
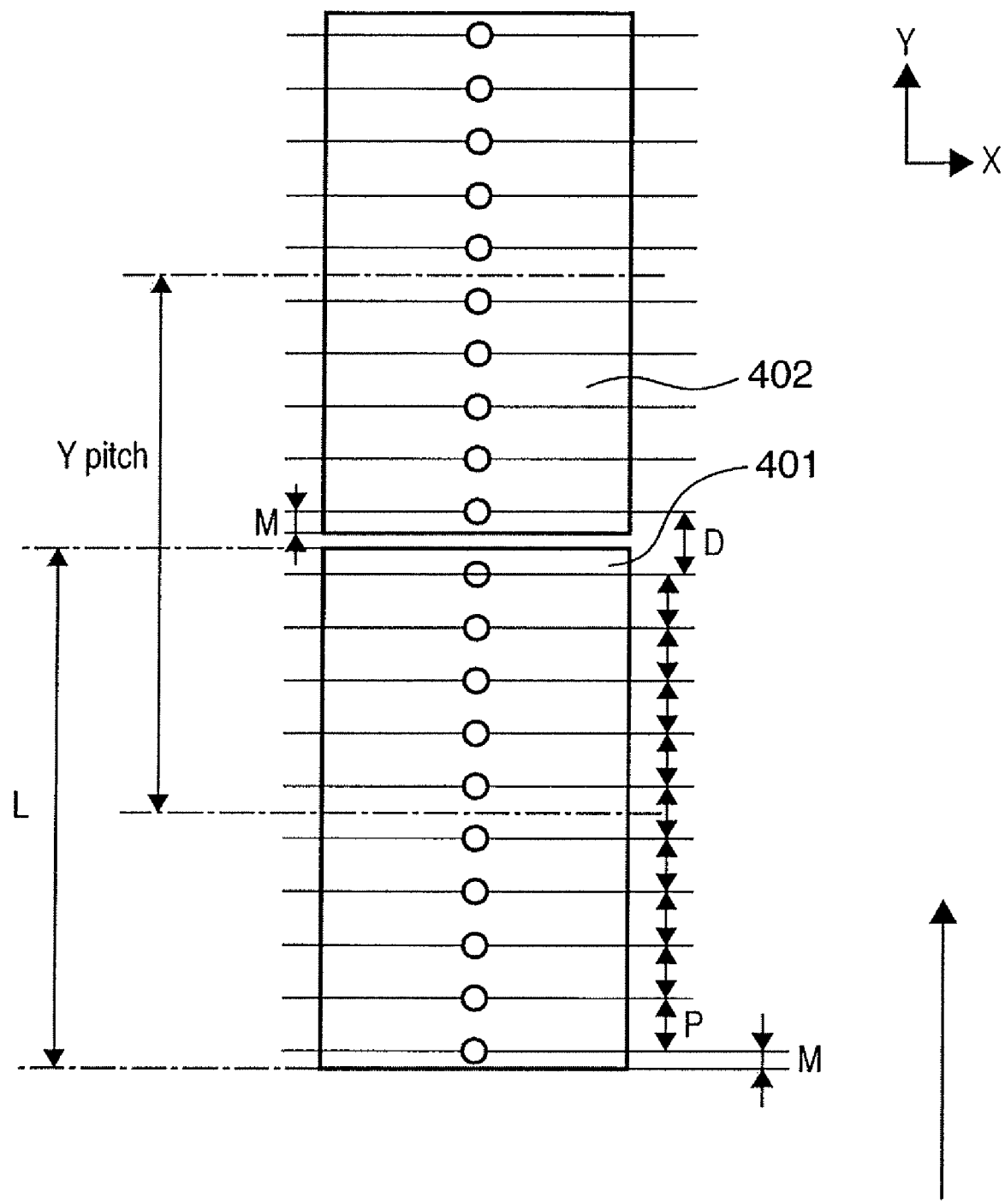
FIG. 4 shows an example arrangement of measurement points in a surface position detecting method according to an exemplary embodiment of the present invention.

Next is a description of the measurement process in a measurement system, with reference to FIGS. 3 and 4.

A measurement system measures surface positions across the entire substrate 4. For example, in the order shown by way of example in FIG. 3, the substrate 4 is scanned by the measurement stage mechanism 22, and surface positions of the substrate 4 are measured in synchronism with the scanning.

Specifically, after the substrate 4 is accelerated at the near side of a shot region 300 to reach a prescribed speed, at that constant speed, the measurement points within the shot region 300 are sequentially measured in a predetermined order. After completion of measurement within the shot region 300, the substrate is moved in the X direction while quickly decelerating to move to the adjacent line. Then, after the substrate is acceleration at the near side of a shot region 301 to reach the prescribed speed, the surface positions of the plurality of shots lined up in the Y direction in the manner of shot region 301, shot region 302, shot region 303, are measured with a constant speed. Afterward, the substrate moves in the X direction to shift to the adjacent line, while quickly decelerating and, after reaching an acceleration start point, the substrate is accelerated in the opposite direction and a plurality of shot regions in the Y direction are measured, in order, with a constant speed. The procedure as described above repeats until reaching the last shot region. By adopting such a configuration, it is not necessary to accelerate/decelerate the stage for each shot region, so high throughput is obtainable.

Next is a description of the arrangement of measurement points during constant speed scanning, with reference to FIG. 4.

An interval P of the measurement points in the direction in which the substrate is driven, for example, can be set according to the detection area (average area) of the first surface-position detection unit 50, or the measurement scanning speed. Here, the surface position can be detected as a value obtained by averaging surface positions in the detection area of the substrate. Thus, the detection area can be understood to be an average area.

In the shot region, the measurement points are arranged or defined with approximately equal spacing according to the sample pitch P. The first measurement point within the first shot region 401 is arranged to ensure a sufficient margin M from the shot end necessary in consideration of the results of the averaging surface position within the detection area with the first surface-position detection unit 50. With respect to the subsequent shot region, as well, the first measurement point is arranged at a position that ensures the margin M from the shot edge.

Next, an interval D between the last measurement point within the shot region 401 and the first measurement point within the shot region 402 is determined. Here, L is the length in the scanning direction of one shot region (scanning length), and the Y pitch is the distance between shot regions.

When the number of intervals between measurement points in the shot region is K [intervals], $$K=\text{INT}\,((L-M)/P),$$

and INT ( ) is an operator symbol wherein decimal fractions of a number are rounded off.

The space D is:

$$D=Y\text{pitch}-(K\times P).$$

When the scanning speed is S, in the shot region, a time interval T1 between the timing that one measurement point is measured and the timing that the next measurement point is measured (below, the time interval between measurement timings within a shot region is measured and the timing that the first measurement point in the next shot region is measured (below, the time interval between measurement timings between shot regions) is D/S. Thus, the difference ΔT (below, an amount of timing variation) between the time interval between measurement timings between shot regions T2 and the time interval T1 between measurement timings within a shot region is $$\Delta T=T2-T1=(D-P)/S.$$

That is, from measurement of the last measurement point in a shot region to measurement of the first measurement point in the next shot region, there is a wait of a time obtained by adding ΔT to the time interval T1 between measurement timings within a shot region.

For example, assume that the distance from the adjacent shot Y pitch is 33 [mm], the scanning length L is 33 [mm], the margin M is 0.3 [mm], and the sample pitch is 0.4 [mm]. In this case, the number of measurement points within the shot is K+1=INT ((33−0.3)/0.4)+1=82[points]. Also, a margin of 0.3 [mm] is also ensured at the position where exposure ends.

However, with a method in which all of the intervals in the scanning direction of all of the measurement points in the substrate are a common interval, the position of the measurement points in the next shot region depends on the position of the last measurement point in the previous shot region. Accordingly, with respect to the first measurement point of that next shot region, a sufficient margin from an edge of the shot region may not be obtained, leading to a reduction in measurement accuracy.

On the other hand, in an exemplary embodiment of the present invention, between shot regions, as the interval between measurement timings, the time T2 is provided, obtained by adding ΔT to the interval between measurement timings within a shot region. This means that in all of the shots, the margin M from an edge of the shot region to the first measurement point is ensured. Thus, the arrangement of measurement points is the same in all of the shot regions, so that it is possible to measure the surface position with the same conditions for all of the shot regions.

Here, with respect to each shot, by performing scanning accompanied by acceleration, constant speed, and deceleration, it is easy to set the measurement points in the vicinity of the exposure start position and the exposure end position for each shot. However, in this case, throughput may decrease, because it becomes necessary to accelerate and decelerate for each shot. Accordingly, with respect to shot regions belonging to a single line, it is preferable to measure the surface position while scanning the substrate with a constant speed.

Figure 5:
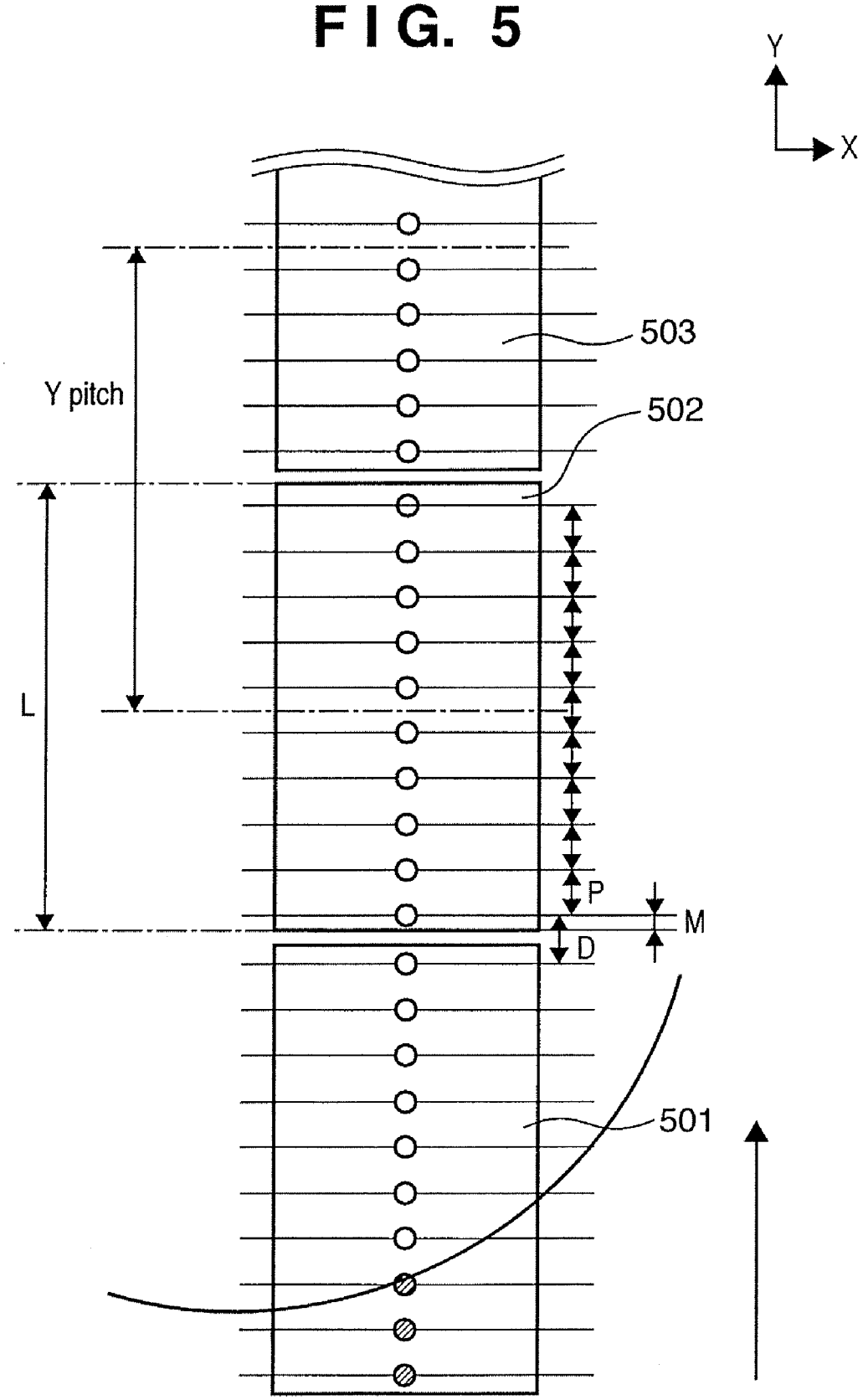
FIG. 5 shows an example arrangement of measurement points in a surface position detecting method according to an exemplary embodiment of the present invention.

As shown in FIG. 5, in the shot region, a complete shot region and an incomplete shot region (lacking shot region) may be present. An incomplete shot region is a shot region in which a portion protrudes from the effective area in the substrate. In this sort of shot layout, for example, a desired position (for example, an edge) of a complete shot region 502 may be used as a reference position, the complete shot region 502 being the first to be measured among the shot regions aligned in the scanning direction. The measurement timings of the measurement points of the incomplete shot region 501 and the subsequent complete shot region 503 are preferably set based on the positional relationship relative to the reference position.

In order to correct discrepancies in the focus measurement value due to discrepancies in the surface state of each measurement point, it is preferable to determine a correction offset value from a measurement taken in advance. When performing the exposure process of each shot region, it is preferable to correct the measurement value for each measurement point based on this offset value.

In order to detect a deviation of the position (Z) in the Z direction and the tilt ($\alpha$, $\beta$) of the exposure area of the substrate 4, it is necessary to consider the relationship between the shape of the illumination area and the pattern structure (actual height difference) of the exposure area. Here, a detection error factor due to, for example, the effect of interference between light reflected by the resist surface of the substrate 4 and the light reflected by the substrate surface of the substrate 4 can be considered. That effect depends on the material of the substrate surface, which surface of the substrate 4 and the light reflected by the substrate surface of the substrate 4 can be considered. That effect depends on the material of the substrate surface, which, with a broad meaning, is the pattern structure, and is significant enough that the effect cannot be ignored with a highly reflective wiring material, such as aluminum.

Also, when an electrostatic capacitance sensor is used as a surface-position detection sensor with a GaAs substrate used as a substrate for a high speed device or a light emitting diode, it is known that there is a large measurement offset, unlike that with an Si substrate.

In the exposure apparatus shown, for example, in FIG. 1, an offset value (correction value) is obtained to correct errors in the focus measurement value due to discrepancies in the surface state at the measurement points, i.e., errors due to the pattern structure. Specifically, an offset value can be calculated for a plurality of sample shot regions 601 to 608 (FIG. 6) using the surface position measurement values measured while scanning the substrate. The measurement data at each of the measurement points stored in the memory 130 is corrected using an offset value (correction value) corresponding to the pattern structure of each measurement point.

Figure 6:
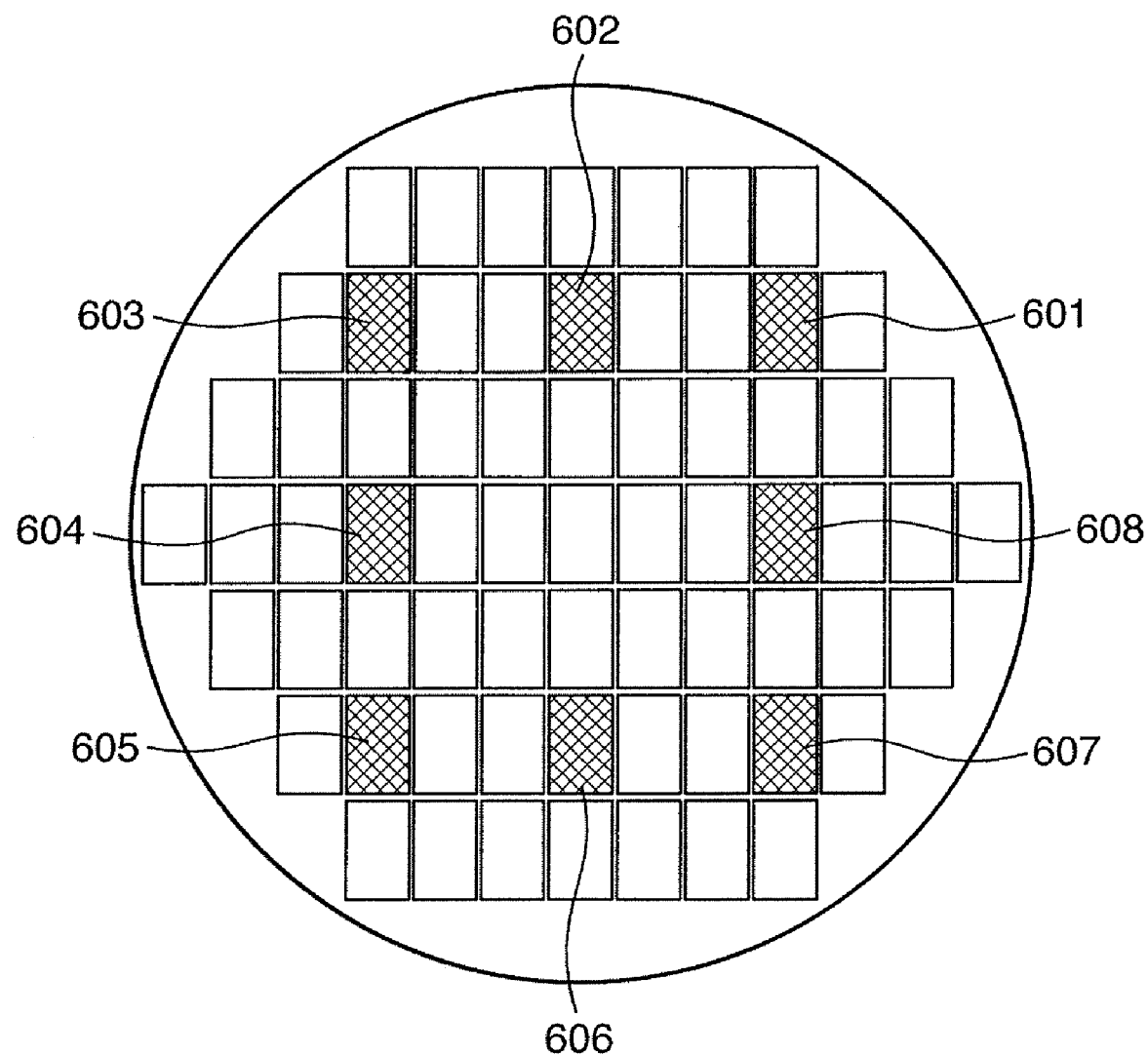
FIG. 6 is a plan view that shows an example of selecting a sample shot for evaluating the surface state of an exposure area of a substrate.
Figure 7:
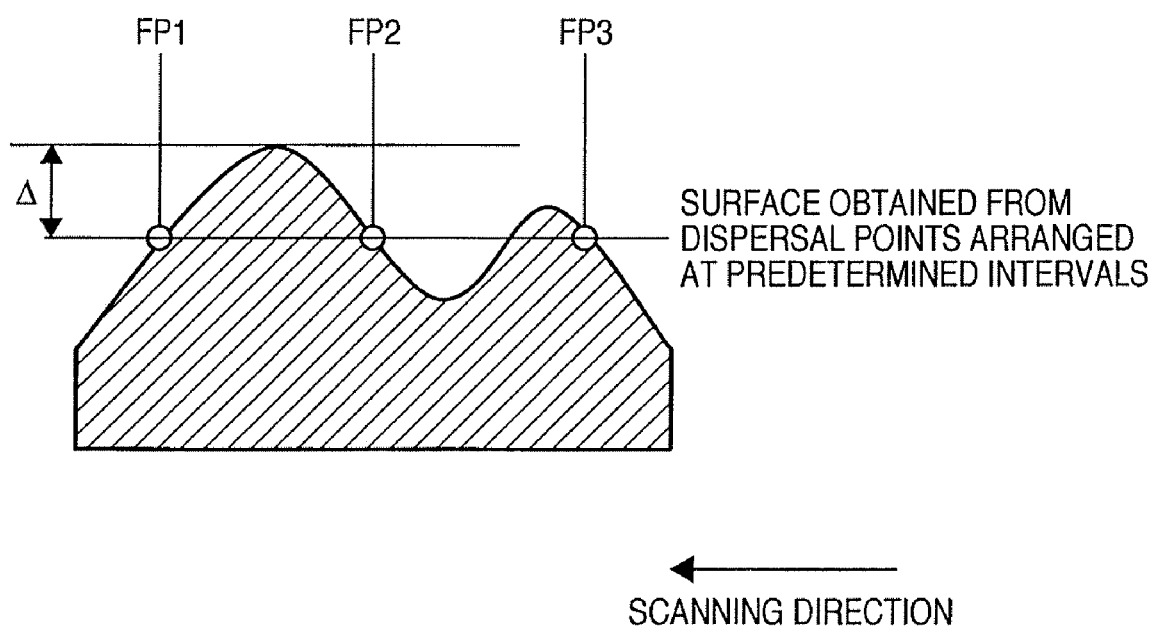
FIG. 7 schematically shows how the focus of a substrate surface is measured at broad intervals.

The sample shot arrangement in FIG. 6 is one example; the number and the arrangement of sample shot regions are not limited to those shown in this example.

Below, a surface position detecting method and an exposure method of an exemplary embodiment of the present invention will be described with reference to FIG. 8. The process below is controlled by the main controller 110.

Here, in the exposure apparatus shown, for example, in FIG. 1, a light emitting diode (LED) is used as the light source 10, and a linear CCD sensor is used as the photosensor 19.

In Step 801, one iteration of a process is started by the main controller 110 receiving a start command. In step 802, a substrate is placed on the chuck 5 on the measurement stage mechanism 22, and held by the chuck 5.

In step 803, the main controller 100 obtains the size (including L) of the scanning measurement area as a reference, and the time interval T1 between measurement timings within a shot region and an amount of timing variation ΔT based on shot layout information (including Y pitch), scanning speed S, and CCD accumulation time, and stores them in the memory 130.

In step 804, under the control of the main controller 110, the entire surface of the substrate is measured while scanning at a constant speed for each line with the procedure shown, for example, in FIG. 3. The surface position information (position information using the reference surface 9 as a reference), obtained as a result of measurement, is stored in the memory 130.

In step 805, the main controller 110 calculates an offset value (correction value) for correcting the measurement error factor, depending on the pattern structure (actual height difference within the exposure area, and substrate material). The main controller 110, as shown, for example, in FIG. 6, performs a calculation for the plurality of sample shot regions (601 to 608) in a diagonal line using the surface position measurement values (surface position data). The main controller 110, with this calculation, calculates an offset value (correction value) for correcting errors depending on the pattern structure. In step 806, the main controller 110 stores the calculated offset values (correction values) in the memory 130.

In step 807, the substrate is moved onto the exposure stage mechanism 6 while being held by the substrate chuck 5.

In step 808, the Z stage of the exposure stage mechanism 6 is driven in order to focus using the reticle focusing mark 23 and the reference surface 9 on the substrate chuck.

In step 809, the main controller 110, while using the correction values, corrects the surface position information that uses the reference surface of the substrate chuck 5 as a reference, and calculates a correction-driving amount for matching the surface of the substrate 4 to the optimal-exposure image plane position. Then, the main controller 110 executes scanning exposure of the shot regions while correcting the surface positions of the substrate 4 according to that correction-driving amount.

In step 810, it is judged whether or not exposure is finished for all of the shots on the substrate. If not finished, the process returns to step 809, and if exposure of all of the shots is finished, the process proceeds to step 811. In step 811, the substrate is discharged from the exposure stage mechanism 6, and, in step 812, one iteration of the exposure sequence is finished.

In the above embodiment, an example exposure apparatus was described in which the measurement stage and the exposure stage exist independently, but this is only one example of an application of the present invention. The exposure apparatus of the present invention, for example, may be configured with one or a plurality of stages used both as a measurement stage and as an exposure stage. Alternatively, the exposure apparatus of the present may be provided with one or a plurality of measurement stages and a plurality of exposure stages.

Figure 8:
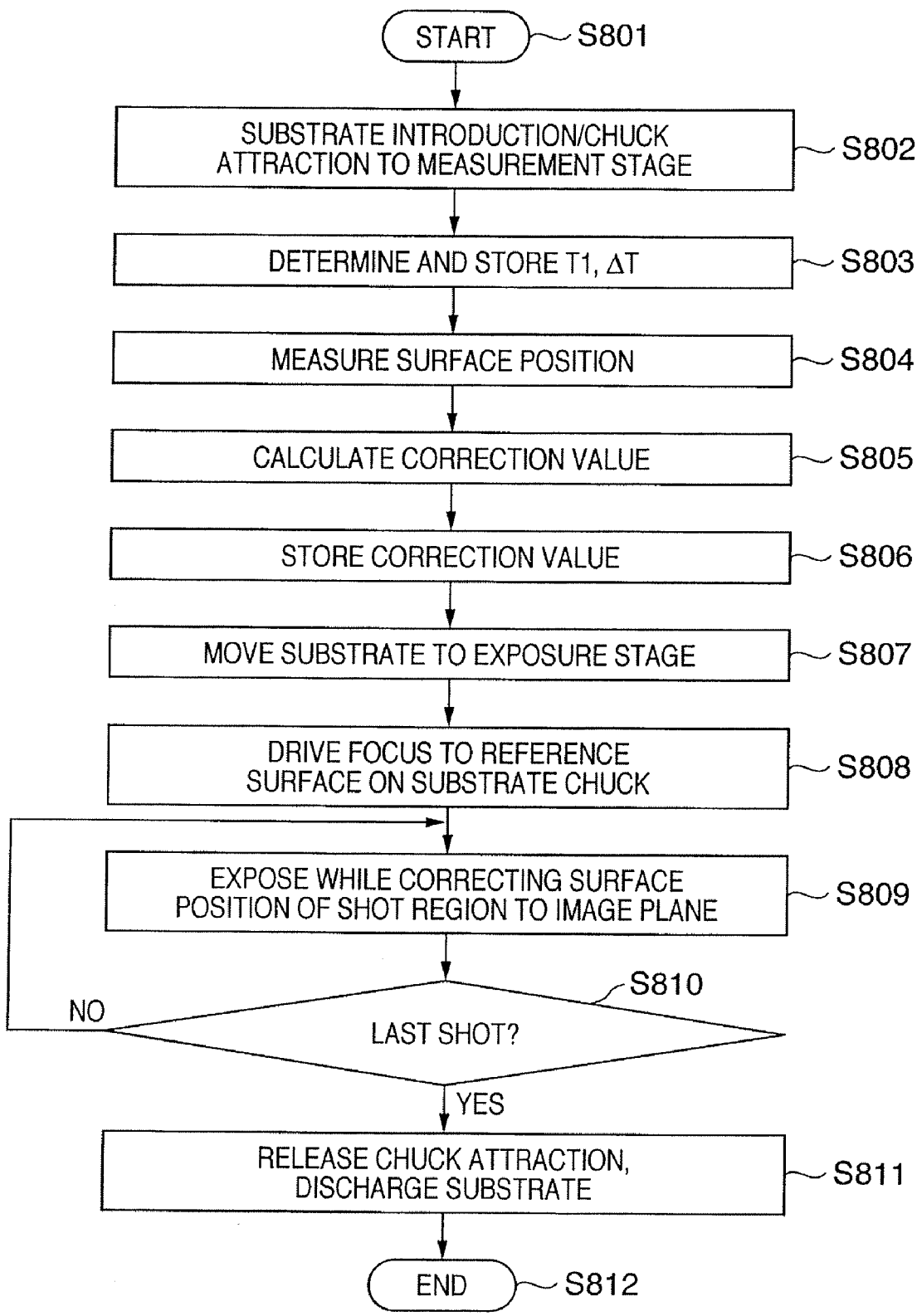
FIG. 8 is a flowchart that shows the operation of an exposure apparatus according to an exemplary embodiment of the present invention.
Figure 9:
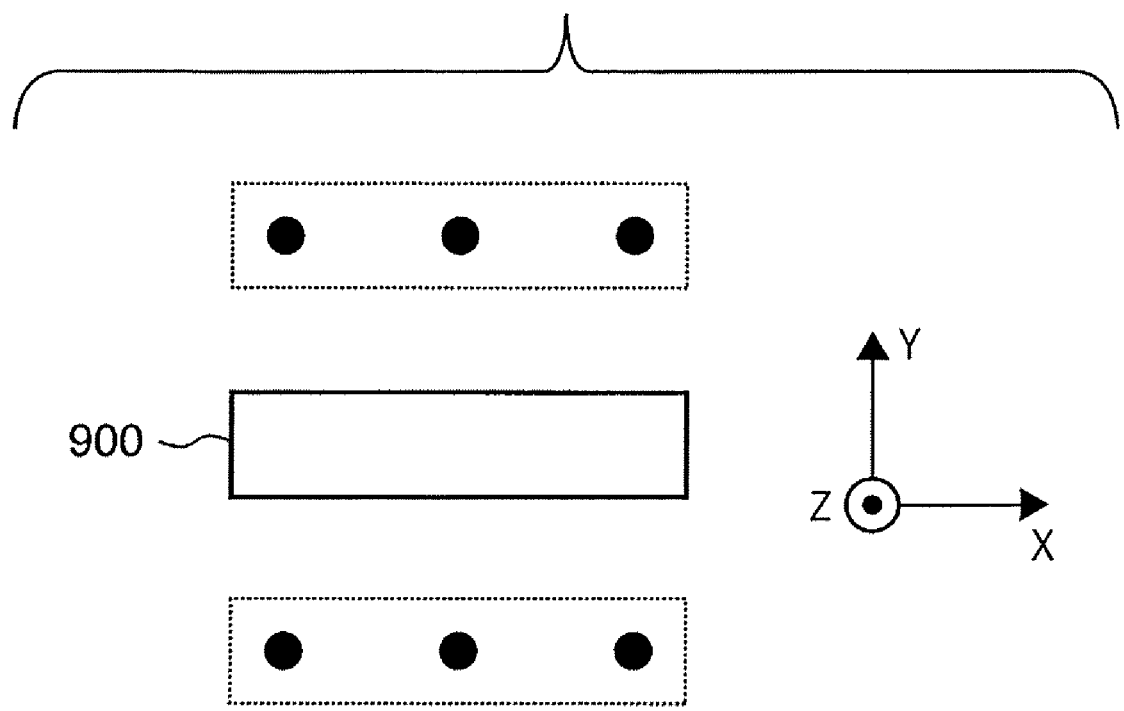
FIG. 9 shows an example arrangement of measurement points.

In the embodiment shown in FIG. 8, steps 801 to 811 may be executed in that order, or, in parallel with the scanning exposure from step 807 onward, the next substrate may be introduced to the measurement stage, and the process of steps 801 to 806 performed. In this case, it is possible to continuously process substrates effectively, so that highly efficient exposure processing is possible.

Figure 11:
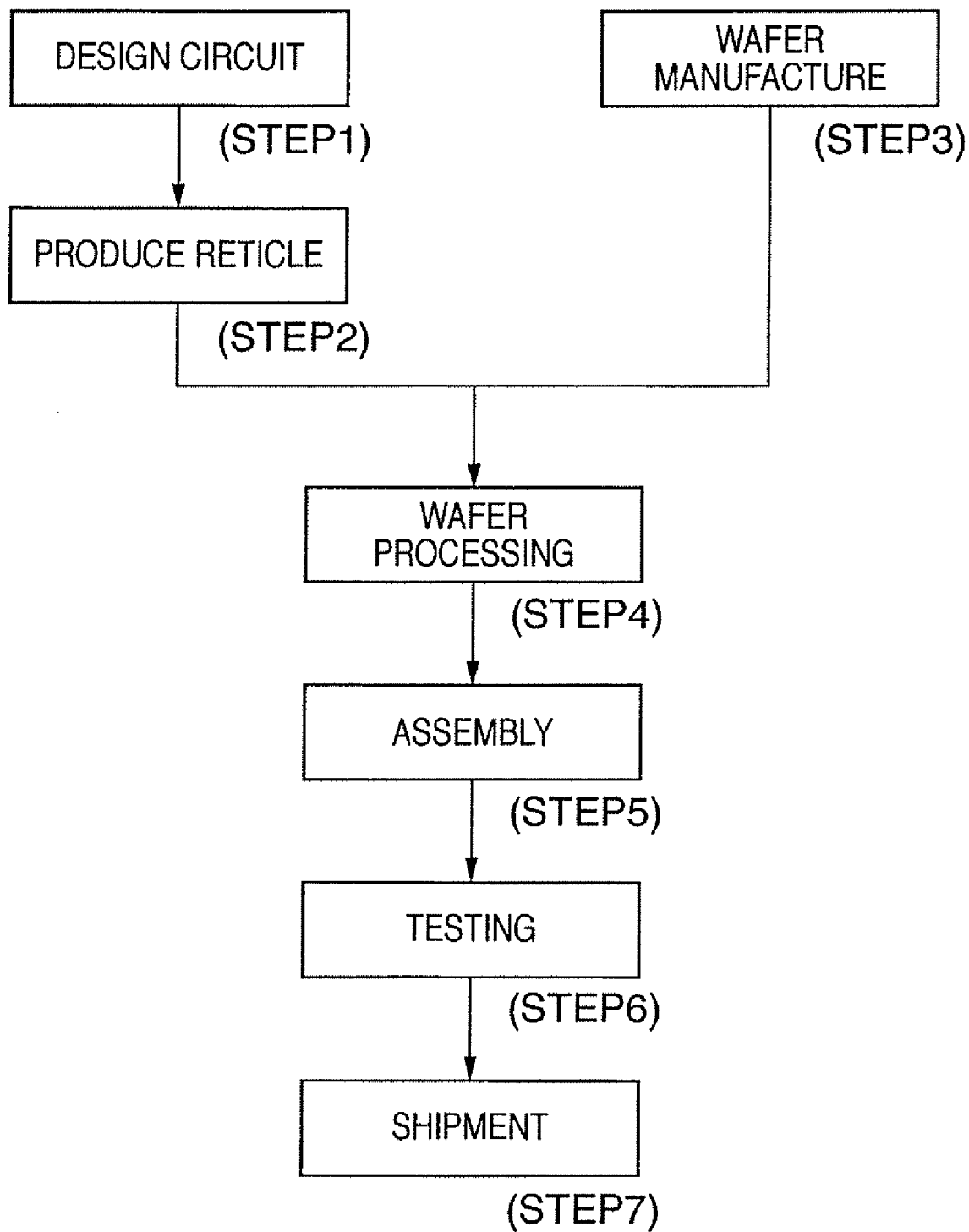
FIG. 11 shows the overall flow of a manufacturing process for manufacturing a semiconductor device.

Next is a description of a manufacturing process for a device using the above exposure apparatus. FIG. 11 shows the overall flow of a manufacturing process for manufacturing a semiconductor device. In step 1 (circuit design), circuit design of the semiconductor device is performed. In step 2 (reticle production), a reticle is produced based on the designed circuit pattern. On the other hand, in step 3 (wafer manufacture) a wafer (also referred to as a substrate) is manufactured using a material such as silicon. Step 4 (wafer processing) is referred to as a pre-process, in which the actual circuit is formed on the wafer with a lithography technique using the above reticle and wafer. Next, step 5 (assembly) is referred to as a post-process, in which the wafer produced in step 4 is converted to a semiconductor chip, and includes assembly steps, such as assembly (dicing and bonding) and packaging (chip enclosure). In step 6 (testing), testing of the semiconductor device produced in step 5 is performed, such as operation testing and durability testing. A semiconductor device that has passed through these steps is completed, and is then shipped (step 7).

Figure 12:
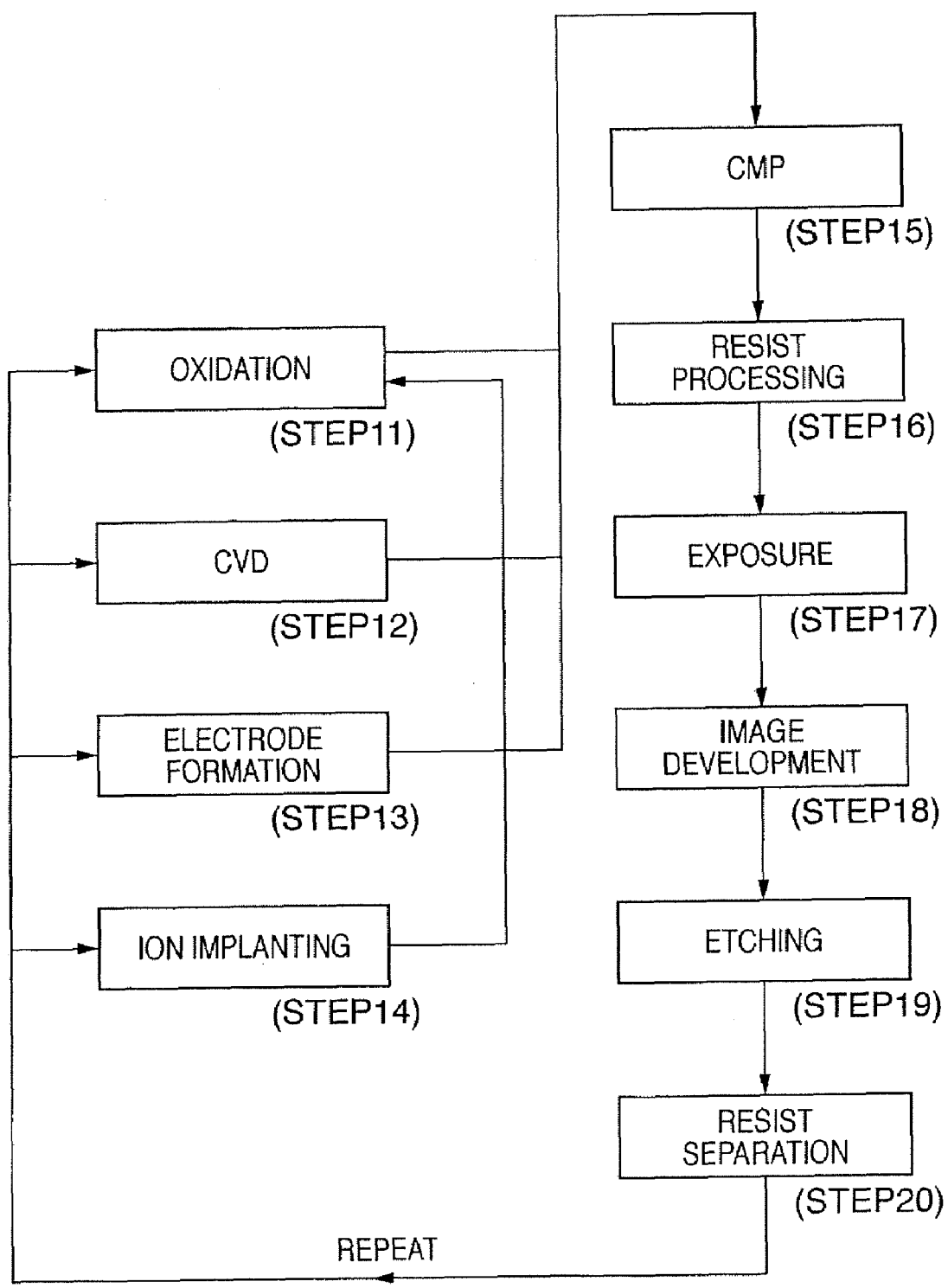
FIG. 12 shows the flow of a wafer process in detail.

FIG. 12 shows the flow of the wafer processing in detail. In step 11 (oxidation), the surface of the wafer is oxidized. In step 12 (CVD), an insulating film is formed on the wafer surface. In step 13 (electrode formation) electrodes are formed on the wafer by vapor deposition. In step 14 (ion implanting), ions are implanted in the wafer. In step 15 (CMP), the wafer surface is flatted by performing chemical-mechanical planarization. In step 16 (resist processing), a photosensitive agent is applied to the wafer. In step 17 (exposure), using the above exposure apparatus, the wafer, on which the photosensitive agent has been applied via the mask in which the circuit pattern has been formed, is exposed to form a latent image pattern in the resist. In step 18 (image development), the latent image pattern transferred to the wafer is developed to form a resist pattern. In step 19 (etching), a layer below the resist pattern or the substrate is etched via a portion where the resist pattern is opened. In step 20 (resist separation), the unnecessary resist after etching is completed is removed. By repeating these steps, multiple circuit patterns are formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus for exposing a substrate to light while the substrate is scanned, the apparatus comprising:
   a stage configured to hold the substrate and to move;
   a measuring device configured to measure a position of a surface of the substrate held by said stage; and
   a controller configured to define an arrangement of measurement points with respect to each of a plurality of shot regions arranged along a straight line, and to cause said measuring device to sequentially measure positions of the surface with respect to the defined measurement points in the plurality of shot regions, while causing said stage to move to scan the substrate along the straight line, by controlling a timing at which said measuring device measures a position of the surface so that a first time interval and a second time interval are different from each other, the first time interval being an interval between a first time at which said measuring device measures a position of the surface with respect to the last measurement point in a first shot region and a second time at which said measuring device measures a position of the surface with respect to a second measurement point adjacent to the last measurement point in the first shot region, the second time interval being an interval between the first time and a third time at which said measuring device measures a position of the surface with respect to the first measurement point in a second shot region next to the first shot region,
   wherein said controller is configured to define the arrangement such that an interval of each two of the adjacent measurement points in a shot region is a common first distance, and an interval between the last measurement point in a first shot region and the first measurement point in a second shot region next to the first shot region is a second distance.

2. An exposure apparatus for exposing a substrate to light while the substrate is scanned, the apparatus comprising:
   a stage configured to hold the substrate and to move;
   a measuring device configured to measure a position of a surface of the substrate held by said stage; and
   a controller configured to define an arrangement of measurement points with respect to each of a plurality of shot regions arranged along a straight line, and to cause said measuring device to sequentially measure positions of the surface with respect to the defined measurement points in the plurality of shot regions, while causing said stage to move to scan the substrate along the straight line, by controlling a timing at which said measuring device measures a position of the surface so that a first time interval and a second time interval are different from each other, the first time interval being an interval between a first time at which said measuring device measures a position of the surface with respect to the last measurement point in a first shot region and a second time at which said measuring device measures a position of the surface with respect to a second measurement point adjacent to the last measurement point in the first shot region, the second time interval being an interval between the first time and a third time at which said measuring device measures a position of the surface with respect to the first measurement point in a second shot region next to the first shot region,
   wherein said controller is configured to cause said stage to move with a constant speed while causing said measuring device to sequentially measure positions of the surface with respect to the defined measurement points in the first and second shot regions arranged along the straight line, and
   wherein said controller is configured to control measurement timings of said measuring device such that said measuring device measures adjacent two measurement points in the first shot region and adjacent two measurement points in the second shot region at the first time interval, and measures the last measurement point in the first shot region and the first measurement point in the second shot region at the second time interval.

3. An exposure apparatus according to claim 2, further comprising an exposure station, which includes a projection optical system configured to project light from a reticle to the substrate.

* * * * *